United States Patent [19]
Giebel

[11] Patent Number: 4,733,394
[45] Date of Patent: Mar. 22, 1988

[54] ELECTRICALLY PROGRAMMABLE SEMICONDUCTOR MEMORY SHOWING REDUNDANCE

[75] Inventor: Burkhard Giebel, Denzlingen, Fed. Rep. of Germany

[73] Assignee: Deutsche Itt Industries GmbH, Freiburg, Fed. Rep. of Germany

[21] Appl. No.: 855,141

[22] Filed: Apr. 23, 1986

[30] Foreign Application Priority Data

Apr. 23, 1985 [DE] Fed. Rep. of Germany ..... 85104945

[51] Int. Cl.4 ............................................. G01R 31/28
[52] U.S. Cl. ...................................... 371/21; 365/201; 371/10
[58] Field of Search ............................. 371/10, 21, 28; 365/200, 201

[56] References Cited

U.S. PATENT DOCUMENTS

| | | | |
|---|---|---|---|
| 4,460,997 | 7/1984 | Harns | 371/10 |
| 4,493,075 | 1/1985 | Anderson et al. | 371/10 |
| 4,503,538 | 3/1985 | Fritz | 371/28 |
| 4,519,076 | 5/1985 | Priel et al. | 371/21 |
| 4,524,429 | 6/1985 | Giebel | 365/154 |
| 4,553,225 | 11/1985 | Ohe | 365/201 |
| 4,586,178 | 4/1986 | Bosse | 371/10 |
| 4,606,025 | 8/1986 | Peters et al. | 371/21 X |
| 4,627,053 | 12/1986 | Yamaki et al. | 371/10 |
| 4,631,724 | 12/1986 | Shimizu | 371/21 |

Primary Examiner—Charles E. Atkinson
Attorney, Agent, or Firm—T. L. Peterson

[57] ABSTRACT

An integrated memory system includes a microcomputer which, at defined intervals and by employing a classifying circuit integrated in an EEPROM, checks the memory cells of the EEPROM with respect to variations of the threshold values. Upon detection of a fault in a row or column which has thus been recognized as being faulty, this faulty row or column whose address is then stored in one EEPROM area, is replaced by a redundant row or column in another area by making use of a correction register.

2 Claims, 1 Drawing Figure

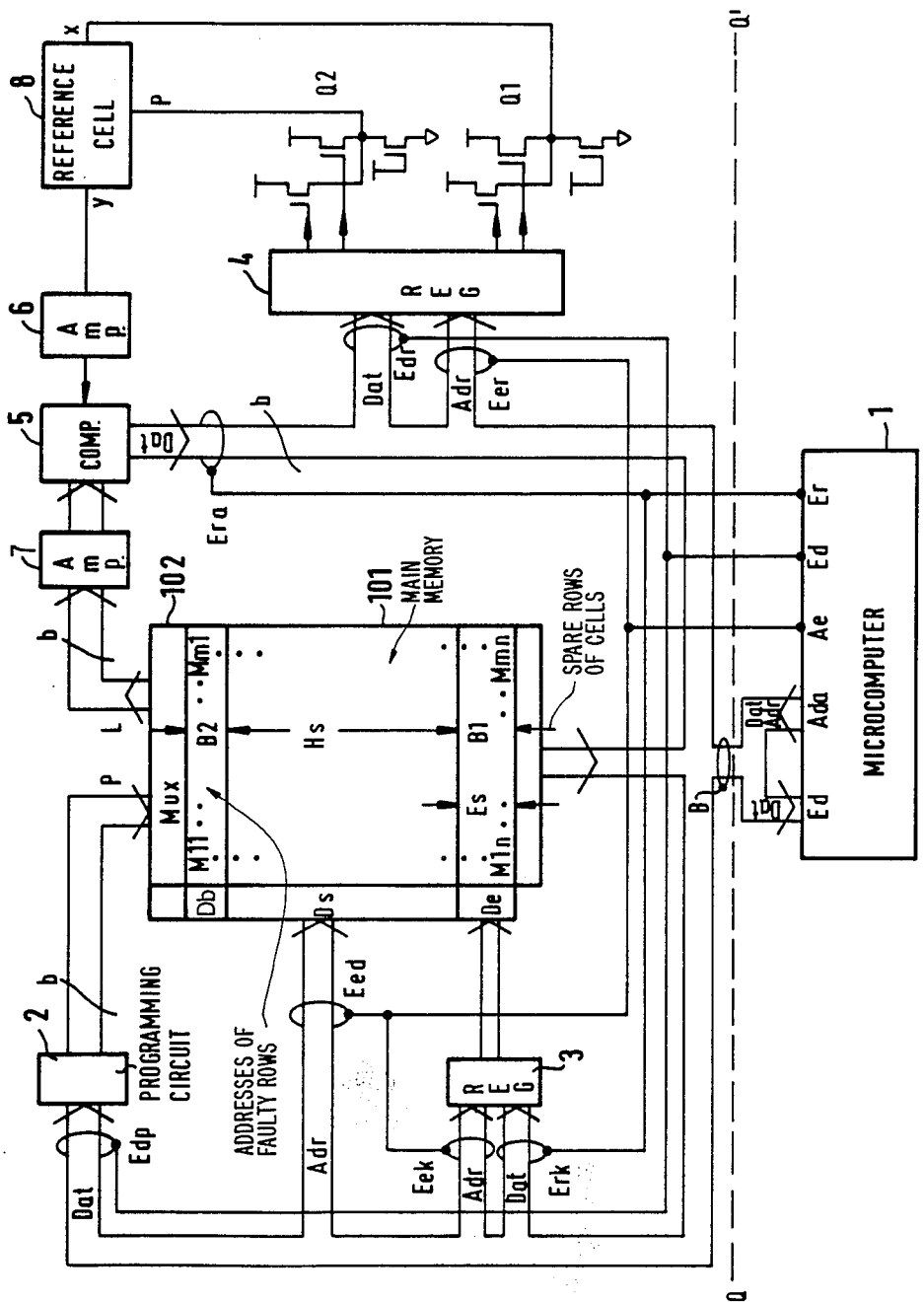

ELECTRICALLY PROGRAMMABLE SEMICONDUCTOR MEMORY SHOWING REDUNDANCE

BACKGROUND OF THE INVENTION

The invention pertains to electrically programmable (reprogrammable) semiconductor memories.

To increase the total manufacturing yield, such memories comprise redundant row or columns which, upon determination of faulty rows or columns, that is, of rows or columns which are found to have at least one faulty memory cell, take the place of the faulting rows or columns, provided that these redundant rows or columns themselves have been ascertained as not being faulty. Since, in the present case, a row redundance is more effective than a column redundance, because rows are more likely to fail than columns, the invention will be described in the following with reference to the row redundance which, however, is not meant to imply any restriction.

For explaining the problem of the memory redundance reference is made to the technical journal "Electronics" of July 28, 1981, pp. 117 to 133. In implementing semiconductor memories having redundance it is common practice to use redundance decoders which are programmed in particular by employing connections capable of being split. Relative thereto, reference is made, for example, to the "IBM Technical Disclosure Bulletin", 18/6 (November 1975), pp. 1777 and 1778, the "1980 IEEE International Solid State Circuit Conference. Digest of Technical Papers", pp. 146 and 147, as well as to the European Patent Appln. EP-A2-83 212. In these semiconductor memories having redundance, the programming of the redundance decoders, in the course of which faulty rows are excluded and unobjectionable rows are inserted, is carried out during the final measurement following fabrication.

An integrated matrix memory of the type to which the invention is directed is disclosed in EP-A1-86 905. The memory comprises m times n nonvolatile reprogrammable memory cells within a first partial area of the memory and, includes spare rows (redundant rows) of a spare memory which, instead of defective rows of the main memory, are capable of being selected via a spare decoder (redundance decoder), with the addresses of the defective rows being filed as data in a second intact partial area of the matrix memory. In this conventional type of matrix memory the data outputs thereof are connected to the data inputs of the correction register, with these data inputs, in response to a data transfer signal from a control stage, for initiating the read operation and for transferring or taking over the data from the second partial area, receiving the addresses of the defective cells. These addresses prevent the spare decoder from writing the data into the faulty rows of the main memory and cause it, instead, to write them into associated rows of the spare memory, in the course of which the decoder of the main memory, via a blocking input, receives a blocking signal from the spare decoder.

During operation of the conventional matrix memory, either at the end of each process of turning on the supply or operating voltage, or else upon deviation of the supply or operating voltage from a nominal value, a reset cycle is initiated in the course of which only the addresses of the second area are read out and taken up into the correction register.

In the conventional type of integrated matrix memory having redundant spare rows or else also spare columns and in accordance with the measuring results of a final measurement carried out after fabrication, the spare addresses of the spare decoders are programmed, for example, by way of manipulating a ROM or by way of electrically programming floating-gate cells, so that in some cases a considerable increase in yield becomes achievable. After that, however, it is no longer possible to determine or ascertain rows which still have become faulty, and to replace them by redundant rows, because the measuring investment of a final measurement is a quite considerable one.

SUMMARY OF THE INVENTION

It is one object of the invention, therefore, to provide a self-supervisory system comprising an integrated memory matrix whose memory cells are checked either row- or column-wisely at certain time intervals with respect to being faultless, and in which, in the event in which rows or columns are found to have become faulty, these rows or columns are replaced by faultless redundant rows or columns respectively.

From the EP-A1-89 397 it was known to integrate a comparator into the integrated memory matrix, including a reference cell, a reference reading amplifier and a source of voltage which is stepwisely adjustable from the outside. This opens up the possibility of carrying out measurements without excessive cost for ascertaining or detecting faulty rows (columns) on the individual memory matrices after encapsulation, provided that, for this purpose, terminals are led to the outside. Up to now, however, it has not been thought to make use of regularly checking the memory matrix for the purpose of detecting faulty rows or columns which can be replaced by redundant rows or columns, especially because it would have to be possible to replace faulty memory rows or memory columns by redundant ones, in accordance with the results of measurements carried out after the encapsulation.

An integrated matrix memory according to the invention includes a comparator, a reading amplifier, a reference reading amplifier, a non-programmable reference cell and the stepwisely adjustable source of voltage as well in the semiconductor body of the integrated matrix memory, and of employing a microcomputer for regularly checking and, if so required, for replacing a faulty row with a faultless one. In some cases the use of such microcomputers merely involves an additional investment in software, for example, in the case of systems already containing a microcomputer.

BRIEF DESCRIPTION OF THE DRAWING both the system and the method according to the invention will now be explained hereinafter with reference being had to the block diagram shown in the accompanying drawing. This block diagram refers to the row redundance. Of course, the invention may equally well also apply to an integrated matrix memory having column redundance.

DETAILED DESCRIPTION

The drawing shows a monolithically integrated matrix memory above the dashline Q—Q' and, a microcomputer to be used with the system below the dashline Q—Q'. It is within the scope of the invention, however, to monolithically integrate the whole system from which, monolithically integrated, there results a microcomputer with a supervised memory matrix whose memory cells are regularly checked with respect to faultlessness and in which, redundant rows or columns are used to replace faulty rows or columns.

The integrated matrix memory 101 has m x n memory cells each having an electrically floating gate. The memory matrix is arranged as a main memory Hs, a first memory area B1 containing spare rows of memory cells, and a second memory area B2 into which the addresses of faulty rows of the main memory Hs are stored. Data input and output from the memory matrix is via multiplexer 102. A decoder Ds selects rows in main memory Hs, redundance decoder De selects rows in the first memory area B1, and decoder Db selects rows in the second memory area B2.

The central control unit of the system according to the invention is the microcomputer 1 to whose data input Ed and to whose data/address output Ada the bus B is connected, via which, as is illustrated by the arrows on the bus B, the data and/or addresses are capable of reaching into the programming circuit 2, into the decoder parts Ds, De and Db, into the correction register 3 and into the register 4. Moreover, it is possible for the data appearing at the output of the comparators 5, viz. the data referring to the measurements of comparing the memory cells to the reference cell 8, to be fed into the microcomputer 1 for being logically reconditioned.

Furthermore, the microcomputer 1 comprises the address-release output Ae at which an address-release signal occurs which is applied to the address-release input Eed of the partial decoder Ds, to the address-release input Eek of the correction register 3, and to the address-release input Eer of the register 4, thus enabling there the selection of the address.

Also, the microcomputer 1 comprises the data-release output Ed which is connected to both the data-release input Edr of the register 4 and to the data-release input Edb of the programming circuit 2. In the event of a data-release signal occurring there, the data signals existing on the bus B are simultaneously fed into both the register 4 and the programming circuit 2.

The microcomputer 1 has a read-release output Er which is connected to both the read-release input Era of the comparator 5 and the read-release input Erk of the correction register 3. In the event of a read-release signal appearing there, the comparison measuring data of the comparators 5 are fed into the microcomputer 1 where they are evaluated. Whenever a defective or faulty row is to be replaced by a redundant one, the data to be transferred from the defecitve row into the redundant row, are temporarily stored in the micromputer 1.

The arrangement consisting of the comparator 5, the reference reading amplifier 6, the reading amplifier 7, the reference cell 8, the voltage sources Q1, Q2 and the integrated register 4 as shown in the first part of the drawing above the dashline Q—Q', corresponds to that of the aforementioned EP-A1-89 397.

In the system according to the invention a reset or initialization cycle of the kind described in the EP-A1-86 905 is triggered by the reset signal upon turning the system on. During initialization, the data stored in the second matrix part B2 are stored into the correction register 3, and the faulty rows of the main memory Hs of the matrix 101 are suspended in that the decoders of these defective rows are blocked. This reset program is stored in the microcomputer 1.

The method of detecting defective rows in the integrated matrix memory of a system according to the invention, and the replacement of at least one of these rows by a spare row of a spare memory are carried out, after the data as stored in the main memory Hs have been read out and intermediately stored in the microcomputer 1, by employing the check programs which are stored in the microcomputer and are performed by the computer either at regular time intervals determined by the computer itself or at time intervals determined otherwise.

The underlying idea of the check programs is to recognize defective or faulty memory cells at an early stage when the operating voltage thereof is checked at regular time intervals, because as a rule the operating voltage value of a defective cell approaches that of the non-programmed state (equal to the reference cell). Initially, the variation rate of the operating voltage in terms of time is small, and increases as the number of additional reprogramming processes increases, until finally the cell no longer appears to be programmable. When the rate of variation is still small there is also a long period of time between recognizing a defective cell by way of reading in the case of an extreme reading threshold, and the definite failure, that is, when the cell can no longer be read correctly even at a normal reading threshold. This period of time can be utilized for the early recognition of defects, because the correct data are still available.

The check program starts out from a main or master memory in which nominal data are stored.

The individual memory rows of the main memory Hs are read out one at a time in turn, with the memory cells of each of these rows being read out several times, i.e., each time with a differently set source of reference voltage Ar. In this way the thresold value Ur of individual memory cells, in accordance with a test program existing in the microcomputer 1, are checked in word by word fashion.

Now the microcomputer 1, based on the deviations corresponding to a first program, determines the deviation of the reading results at an extremely set source of reference voltage compared to that at a normally set source of reference voltage, and is thus capable of detecting whether a row is defective. If a defective memory cell is recognized, the microcomputer 1, according to a second program, causes the defective row to be substituted by an available spare row in the spare memory Es. For this purpose it is necessary for the data of all memory cells of the defective row to be stored at a normally set reference voltage in the microcomputer, and for the address of the defective row to be programmed by the microcomputer into the second matrix part B2. After that, the address of the defective row is applied by the microcomputer 1, after having read out the second matrix part B2, to the input of the correction register 3 and is stored therein. Finally, the data relating to the defective row as stored in the microcomputer, are programmed into the spare row by being controlled by the microcomputer 1.

The invention not only permits increased yield of suitable integrated memory matrices, but also increased service lifetime thereof. The reliability of the data to be stored is secured or safeguarded as long as redundant rows are still free and available.

Moreover, and apart from the programs referred to hereinbefore, there is still stored in the microcomputer 1 the reset program as mentioned in the cited EP-A1-86

905 in which, either at the end of each turn-on process or following a deviation of the operation voltage from a nominal value, a reset cycle of the matrix is initiated, in the course of which the matrix is only supplied with the addresses of the second partial area B2, and the addresses of the defective rows are read into the correction register.

What is claimed is:

1. An integrated memory system comprising:
    an m x n matrix arrangement of memory cells, each memory cell having an electrically floating gate, said memory matrix including:
        a main memory portion;
        main decoder means for accessing data stored in said main memory;
        a first memory portion containing spare rows;
        first decoder means for accessing said spare rows;
        a second memory portion wherein addresses of faulty rows in said main memory are stored; and
        second decoder means for accessing memory rows of said second memory portion;
    a microcomputer for controlling operation of said memory system;
    a reference voltage source, said voltage source being adjustable in steps by said microcomputer;
    a comparator having first inputs receiving first voltage signals derived from the drain currents of the memory transistor of a selected word, said comparator having second inputs coupled to said reference voltage source, said comparator having outputs coupled to said microcomputer;
    a correction register having outputs coupled to said first decoder means for either transferring addresses to said first decoder means or blocking the operation thereof;
    storing means coupled to said microcomputer and to said matrix arrangement for storing data in said matrix arrangement;
    said microcomputer being operable to test for defective rows by transferring data into said main memory via said storing means, reading data stored in said memory and for setting said voltage source, and reading the outputs of said comparator;
    said microcomputer performing said test for defective rows at predetermined time intervals;
    said microcomputer storing addresses of defective rows in said second memory portion and storing data for each defective row in a spare row of said first memory portion.

2. A method of detecting defective rows of an integrated memory matrix comprising the steps of:
    utilizing a microprocessor to periodically test said matrix;
    storing predetermined data in rows of said matrix;
    reading each row of said memory a plurality of times;
    providing a reference voltage level from a reference voltage cell;
    comparing the output voltage level of each cell of a row with said reference voltage level from said reference voltage cell to detect defective rows;
    varying said reference voltage level for each time a row is read out to detect defective rows;
    storing the address of a defective row in one portion of said matrix;
    storing the address of each defective row in a correction register; and
    storing data for a defective row in a selected spare row.

* * * * *